United States Patent [19]
Chang et al.

[11] Patent Number: 5,652,448
[45] Date of Patent: Jul. 29, 1997

[54] NONVOLATILE MEMORY DEVICE

[75] Inventors: Chen-Chi Peter Chang, Newport Beach; Mei F. Li, Mission Viejo; Truc Q. Vu, Signal Hill, all of Calif.

[73] Assignee: Hughes Aircraft Company, Los Angeles, Calif.

[21] Appl. No.: 691,475

[22] Filed: Aug. 2, 1996

Related U.S. Application Data

[62] Division of Ser. No. 554,220, Nov. 6, 1995, Pat. No. 5,578,515.
[51] Int. Cl.$^6$ ........................................ H01L 29/76
[52] U.S. Cl. ............................ 257/315; 257/314; 257/317
[58] Field of Search ................................ 257/239, 315, 257/316, 317, 318, 321, 314; 437/43, 48, 49, 56, 57, 58, 195

[56] References Cited

U.S. PATENT DOCUMENTS

| | | | |
|---|---|---|---|
| 5,148,394 | 9/1992 | Iwahashi | 257/317 |
| 5,270,969 | 12/1993 | Iwahashi | 257/321 |

*Primary Examiner*—Carl W. Whitehead, Jr.
*Attorney, Agent, or Firm*—M. E. Lachman; M. W. Sales; W. K. Denson-Low

[57] ABSTRACT

The gate structure for a nonvolatile memory device comprising an EEPROM and a latch transistor is fabricated on a substrate by patterning the EEPROM's floating gate in a first polysilicon layer, patterning the EEPROM's control gate over the floating gate in a second polysilicon layer, and then collectively patterning the second and first layers to form the latch transistor's stacked gate. The stacked gate includes a thin gate that is electrically connected to the EEPROM floating gate and a protective layer over and electrically isolated from the thin gate. The stacked gate design eliminates unwanted polysilicon spacers between the latch transistor's channel and its drain and source regions, which improves the control of the memory device. The protective layer prevents ion penetration during the implantation of the latch transistor's drain and source regions. The fabrication process and thinness of the latch transistor gate improve the linewidth control of other transistors formed on the substrate and the latch transistor by avoiding overetching and reducing the normal etching time for the latch gate, respectively.

4 Claims, 5 Drawing Sheets

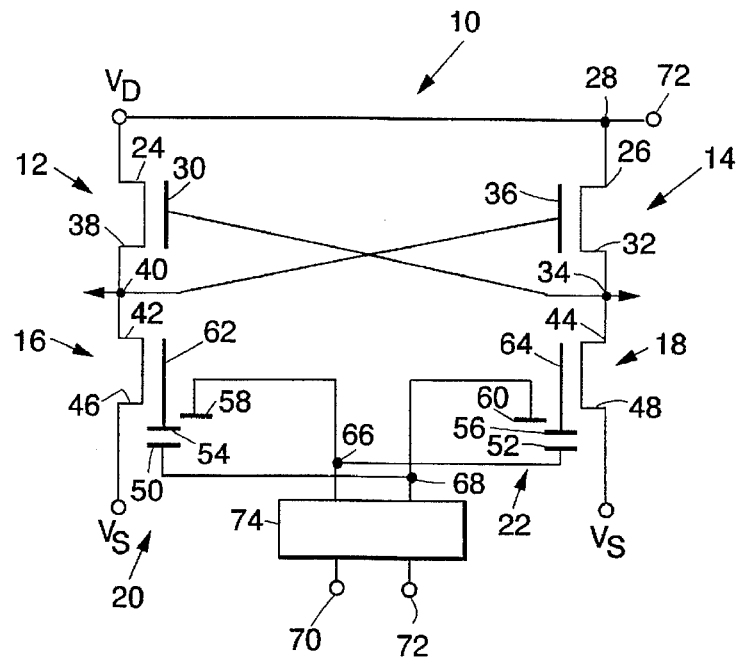
FIG. 1.
(PRIOR ART)
FIG. 3.
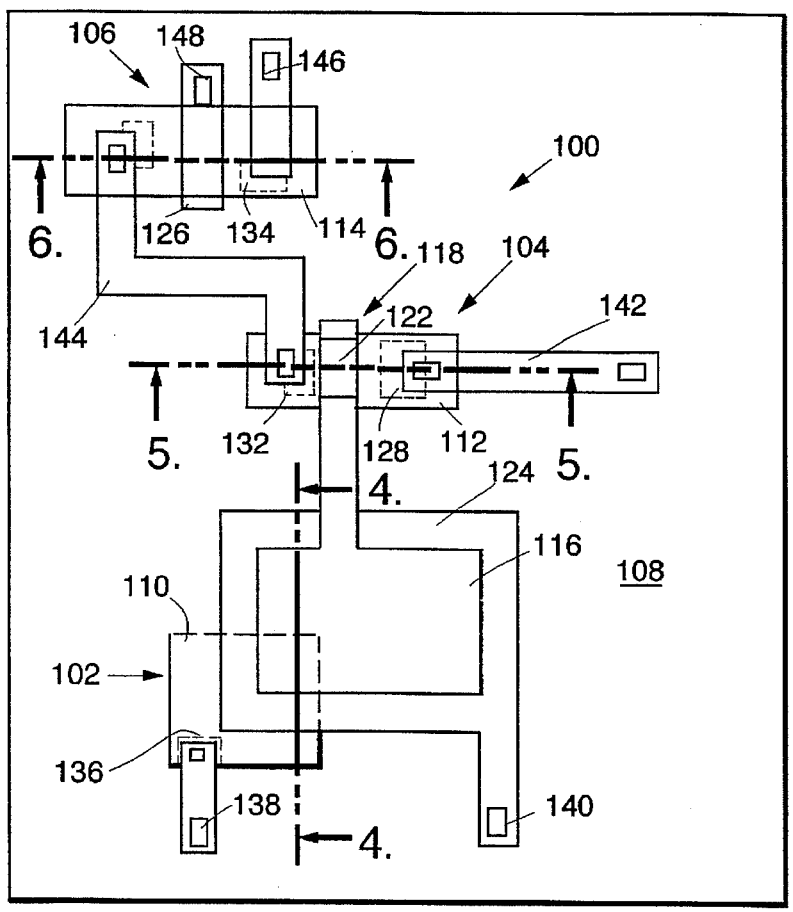

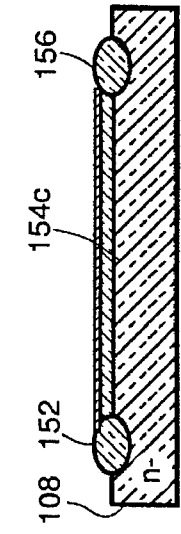
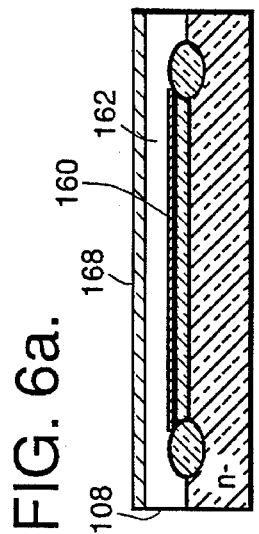
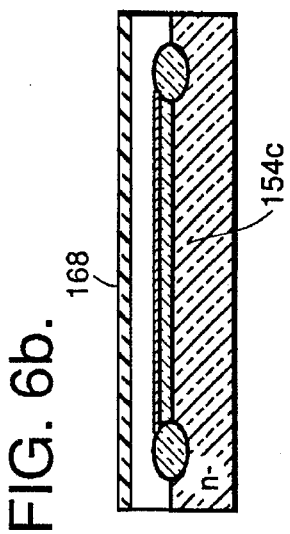
FIG. 4a. FIG. 4b. FIG. 4c.
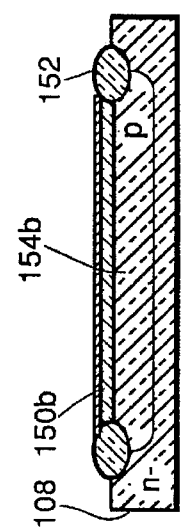
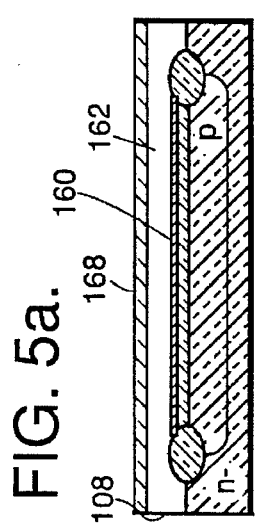
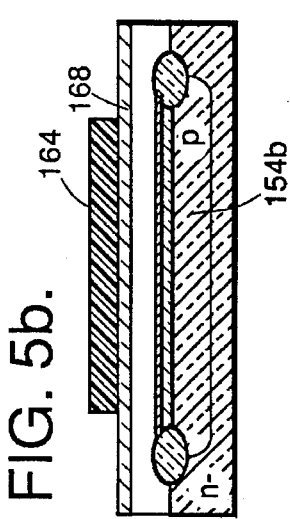
FIG. 5a. FIG. 5b. FIG. 5c.
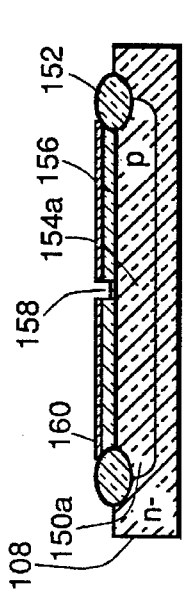
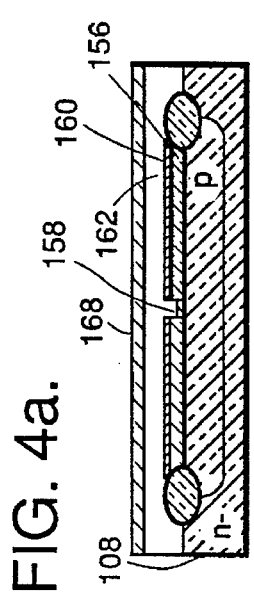
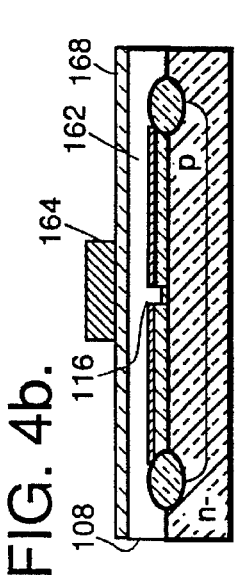
FIG. 6a. FIG. 6b. FIG. 6c.

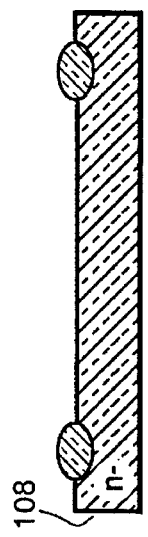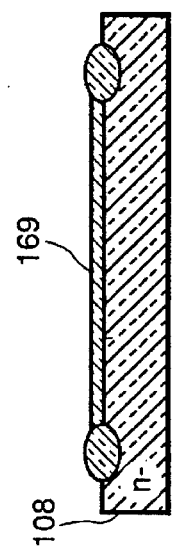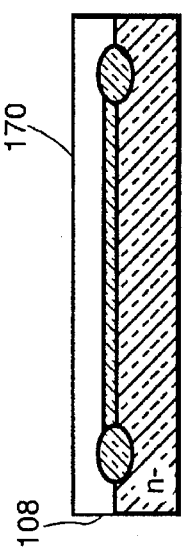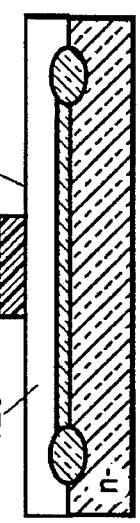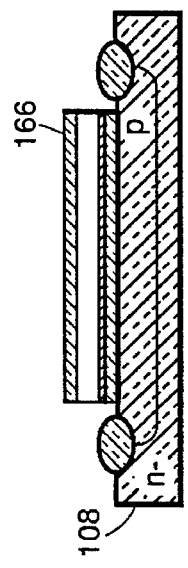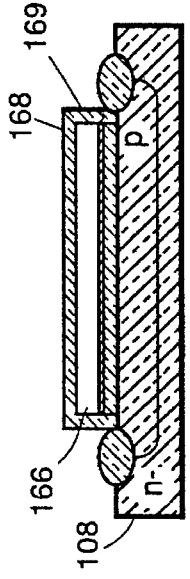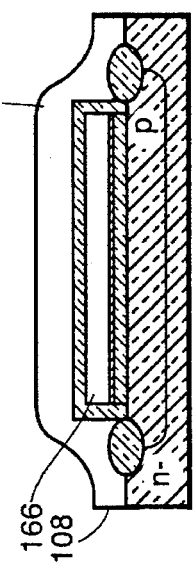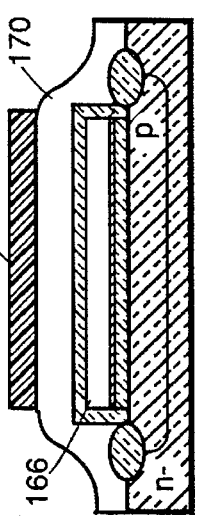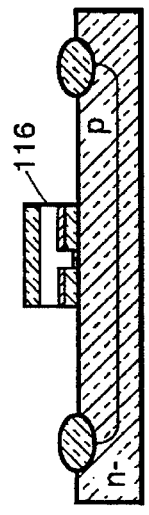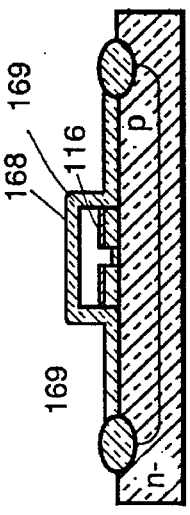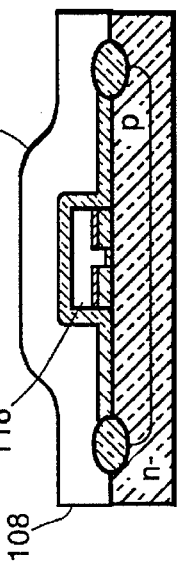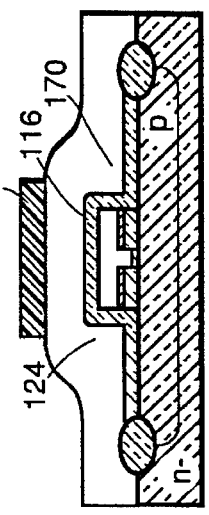

NONVOLATILE MEMORY DEVICE

This is a divisional of application Ser. No. 08/554,220, filed Nov. 6, 1995, now U.S. Pat. No. 5,578,515.

BACKGROUND OF THE INVENTION

1. Field of the Invention

The present invention generally relates to a nonvolatile memory device and a method for fabricating its gate structure, and more specifically to a nonvolatile memory device having an Electrically Erasable-Programmable Read-Only Memory (EEPROM) and a stacked gate latch transistor, and a method for fabricating the EEPROM and latch transistor gate structure.

2. Description of the Related Art

U.S. Pat. No. 4,571,704, "Nonvolatile Latch" to F. Bohac and assigned to Hughes Aircraft Company, the assignee of the present invention, discloses a bistable latch circuit which can be electrically programmed to be stable in only one of its two states so that this same state is always set when power is applied to the circuit. The purpose of the nonvolatile latch is to store data, and to retain that data if power is interrupted.

Since the circuitry of the Bohac patent is also applicable in general to the present invention, it will be described in some detail. FIG. 1 is a schematic diagram of the nonvolatile latch 10 disclosed in the Bohac patent comprising four interconnected MOS transistors 12, 14, 16 and 18, and two EEPROMs 20 and 22. Transistors 12 and 14 are CMOS P-channel field effect transistors (FETs) whose sources 24, 26 are coupled together at a node 28. The gate 30 of transistor 12 is coupled to the drain 32 of transistor 14 at a node 34. Similarly, the gate 36 of transistor 14 is coupled to the drain 38 of transistor 12 at a node 40.

Transistors 16, 18 are N-channel latch MOSFETs whose drains 42, 44 are connected to the drains 38, 32 of the P-channel transistors 12, 14 and whose sources 46, 48 are connected to a low supply voltage $V_S$, typically ground. EEPROMs 20, 22 comprise p-well tie downs 50, 52, floating gates 54, 56 and control gates 58, 60. The floating gates 54, 56 are electrically connected to the gates 62, 64 of latch transistors 16, 18. The EEPROM control gates 58, 60 are connected to the opposing EEPROM p-well tie downs 52, 50 at nodes 66, 68, respectively.

Binary DATA and PROGRAMMING voltages 70, 72 are applied to a programming circuit 74. The PROGRAMMING voltage is also applied to node 28. The programming circuit outputs voltage signals to nodes 66, 68 in accordance with the DATA and PROGRAMMING voltages. When the PROGRAMMING voltage is low, the DATA voltage establishes the binary data value to be stored by the latch. When the PROGRAMMING voltage is high, the stored data is read out of the latch at node 34. The inverse of the stored data can be read out at node 40.

A typical nonvolatile memory could have several thousand nonvolatile latch cells, such as the cell shown in FIG. 1, for storing data. The memory would also include support circuitry for addressing the individual cells, programming the cells and reading out the data. The fabrication process currently used by Hughes Aircraft Company for the nonvolatile latch 10, and specifically for the gate structure, is described in conjunction with FIGS. 2a–2d (which are not to scale) for the EEPROM 20, its latch transistor 16 and P-chann el transistor 12. The fabrication of the P-channel transistor and the problems in controlling its linewidth are common to other P and N-channel transistors on the substrate.

As shown in FIG. 2a, a semiconductor substrate 80 has P-wells 82, 83 that are separated by field oxide regions 84 to form active areas for the EEPROM 20 and the latch transistor 16, respectively. The P-channel transistor is formed directly in the N-substrate. An oxide layer 86 is formed over the substrate and an electron tunnel 88 is etched in the oxide layer above the EEPROM active area 82. A polysilicon layer (not shown) having a thickness of approximately 5000Å is deposited over the substrate, patterned with a photoresist and etched to form the EEPROM floating gate 54 and the latch transistor gate 62 over their respective active areas 82 and 83. A dielectric oxide layer 90 is then formed on the top and sides of the EEPROM floating gate 54 and latch transistor gate 62.

To form the EEPROM control gate 58 and the P-channel transistor gate 30, a second polysilicon layer 92 is deposited over the substrate as shown in FIG. 2b. The layer 92 Generally has a thickness of approximately 5,000Å. However, the deposition process produces a smooth polysilicon layer whose height from the substrate surface decreases smoothly from approximately 10,000Å above the EEPROM floating gate 54 and the latch transistor Gate 62 (the combined thicknesses of the two polysilicon layers) to approximately 5,000Å along the substrate surface. Therefore, the thickness of the deposited polysilicon near either side of the latch transistor gate 62 and EEPROM floating Gate 54 is greater than 5,000Å. A photoresist pattern 94 is patterned over the second polysilicon layer to delineate the EEPROM control gate 58 and the P-chann el transistor gate 30. The exposed polysilicon is etched to a depth of approximately 5000Å to form the EEPROM control gate 58 and the P-channel gate 30 as shown in FIG. 2c.

If the etching process were stopped at this point, polysilicon spacers 96 would be left on either side of the latch transistor gate 62 due to the increased thickness of the second polysilicon layer in these regions. The spacers are approximately 3,000Å wide. The EEPROM control gate 58 covers the floating gate 54, and hence no spacers are formed around the EEPROM.

When the drain and source regions of the latch transistor are subsequently ion implanted, the spacers would block the ions from penetrating the underlying substrate, leaving gaps between a channel area under the latch transistor gate 62 and drain and source regions on either side of the channel. The gaps would seriously increase the channel resistance, thus slowing the latch transistor.

Therefore, as shown in FIG. 2d, the second polysilicon layer is typically overetched, i.e., the etching time is extended beyond the normal time for a given layer thickness, to remove the polysilicon spacers 96, after which the remaining photoresist is dissolved. The normal etching process undercuts the P-channel transistor gate 30 and reduces its width by approximately 0.1μ for each 1μ of vertical etch. Overetching substantially increases the amount of undercutting. For example, a 3μ wide P-channel gate 30 may be undercut so that its actual linewidth is approximately 2.2μ.

The extent of the undercut is not known prior to etching and will vary from device-to-device, making it very difficult to compensate for the undercut in the original design or to know precisely what the actual gate width is after etching. The poor linewidth control reduces the effective length of the channel, thus changing the performance of the P-channel transistor. If the channel length becomes too short, source-to-drain punchthrough can result, destroying the transistor. Consequently, the P-channel transistor is limited to gate widths greater than 1μ.

A common practice to diminish the undercutting problem is to reduce the thickness of the dielectric oxide layer 90 and the first polysilicon layer. This reduces the overetching time, which in turn reduces the amount of undercutting. However, a thin dielectric layer reduces the breakdown voltage between the EEPROM floating gate and its control gate. A thin first polysilicon layer will allow ion implantation penetration in the latch transistor's channel during the source/drain implantations which can increase the leakage current in the device.

SUMMARY OF THE INVENTION

The present invention seeks to provide a nonvolatile memory device and a method for fabricating its gate structure with improved linewidth control, a thinner latch gate and submicron gate widths.

This is accomplished with an EEPROM and a stacked gate latch transistor having a shared gate structure. The shared gate structure is fabricated by depositing a first polysilicon layer over a semiconductor substrate having EEPROM and latch transistor active areas and an electron tunnel. The polysilicon layer is patterned to form an EEPROM floating gate above the electron tunnel, and a first latch transistor gate region that lies over its active area and is electrically connected to the floating gate. A dielectric oxide layer is formed over the floating gate and the first latch transistor gate region, and a second polysilicon layer is deposited over the EEPROM floating gate and first latch transistor gate region on the substrate.

The second polysilicon layer is patterned to form an EEPROM control gate over the floating gate, and a second latch transistor gate region over the first latch transistor gate region. The first and second layers are then patterned with one additional masking step to form a latch transistor stacked gate comprising a protective layer and a gate etched from the second and first latch transistor gate regions, respectively. The latch transistor gate and EEPROM floating gate are electrically connected. The second polysilicon is self-aligned to the first polysilicon in the latch transistor. Therefore, there are no polysilicon spacers, and hence no additional resistance between the channel region and its drain and source regions, which can affect device performance.

By forming the protective layer, which blocks ion penetration during drain/source implantation, over the latch gate, the gate can be made thinner, which makes it easier to do submicron processing. The linewidth control of other transistors formed by the second polysilicon is also improved by avoiding overetching. By enhancing linewidth control, performance of the transistors can be more accurately estimated and the transistors can be fabricated with submicron gate widths.

For a better understanding of the invention, and to show how the same may be carried into effect, reference will now be made, by way of example, to the accompanying drawings.

BRIEF DESCRIPTION OF THE DRAWINGS

FIG. 1, described above, is a schematic diagram of a known nonvolatile latch;

FIG. 3 is a plan view of a portion of a nonvolatile latch; and

FIGS. 4a–4k, 5a–5k and 6a–6k are sectional views illustrating the fabrication of the EEPROM, latch transistor, and P-channel transistor gate structures, respectively, for the nonvolatile latch shown in FIG. 3.

DETAILED DESCRIPTION OF THE INVENTION

Figure 2A:
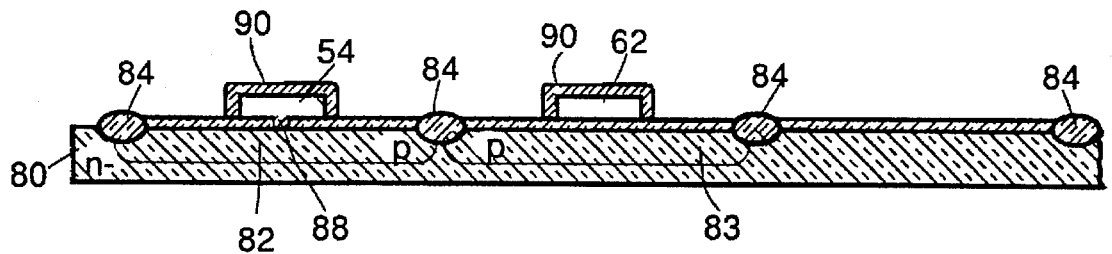
FIGS. 2a–2d, described above, are sectional views of a portion of the nonvolatile latch shown in FIG. 1 that illustrate a known gate structure fabrication process.
Figure 2B:
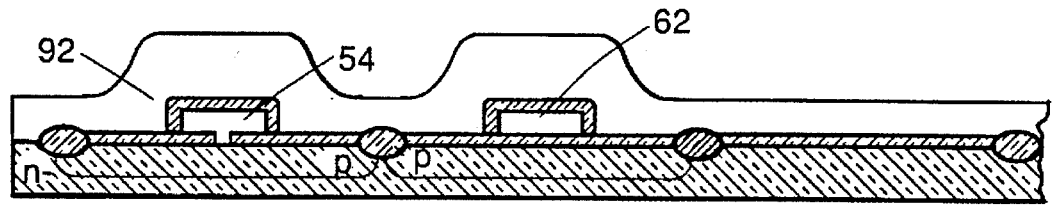
Figure 2C:
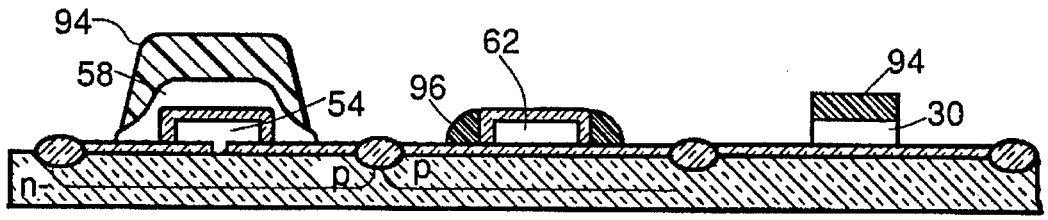
Figure 2D:
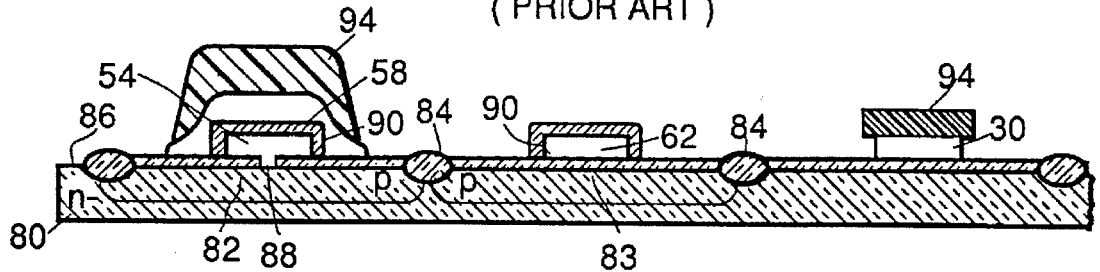

The invention provides a process for fabricating the nonvolatile latch, described above, and specifically the gate structure for the EEPROM and latch transistor. The fabrication process produces a stacked gate for the latch transistor instead of the conventional single polysilicon layer gate described above. The stacked gate includes a thin polysilicon gate, a dielectric layer and a protective electrically isolated polysilicon layer. The fabrication process and the thin polysilicon gate improve the linewidth control of the P-channel and support circuitry transistors and the latch transistor by avoiding overetching and reducing the normal etching time for the latch gate, respectively. By improving linewidth control, the transistor performance is improved and the transistors can be fabricated with submicron gate widths, thus reducing chip sizes.

FIG. 3 shows one of the two symmetrical branches 100 of a nonvolatile latch which, except for the features of the invention, is generally similar to the circuit of FIG. 1. The other branch is fabricated in the same manner and at the same time as the branch shown in FIG. 3, and is not shown for purposes of simplification. The branch includes an EEPROM 102, a latch transistor 104 and a P-channel transistor 106 which are fabricated on a semiconductor substrate 108. Active areas 110, 112 and 114 are defined in the substrate 108 by field oxide regions for the EEPROM, latch transistor and P-channel transistor, respectively.

The gate structure is preferably fabricated by three successive patterning steps, each step comprising forming a photoresist mask, etching the exposed polysilicon and then dissolving the photoresist. A first polysilicon (POLY1) layer, a second polysilicon (POLY2) layer and both POLY2 and POLY1 layers are patterned to form the gate structure by etching the polysilicon exposed by POLY1, POLY2 and Stacked Gate POLY (SGPO) masks, respectively. Etching the polysilicon exposed by the POLY1 and SGPO masks forms the EEPROM floating gate 116 and the latch transistor stacked gate 118, which are electrically connected to each other. The stacked gate comprises a latch gate (not shown) formed from the POLY1 layer and a protective layer 122 that is formed above the latch gate from the POLY2 layer. The protective layer is electrically isolated from the latch gate, and preferably from the remaining circuitry on the substrate; its only function being to prevent ion implantation penetration through the latch into the substrate. The protective layer is closely aligned with the latch gate by etching the polysilicon exposed by the SGPO in the second and then the first polysilicon layers. The EEPROM control gate 124 above the EEPROM floating gate and the P-channel gate 126 are formed by etching the polysilicon in the second layer that is exposed by the POLY2 mask.

Once the gate structure is fabricated, drain regions 132, 130 and source regions 128, 134 of transistors 104 and 106 are ion implanted on either side of the latch transistor stacked gate 118 and P-channel gate 126 in their active areas, and the EEPROM well contact 136 is ion implanted in its p-well near the floating gate. The self-alignment feature of the stacked gate prevents ion penetration of the latch gate and ensures that gaps will not be formed between the drain and source regions and the channel beneath the latch gate.

Metal contacts 138, 140 conduct external programming voltages to the well contact 136 and EEPROM control gate 124. Metal contact 142 connects latch transistor source 128 to a low supply voltage, typically ground. The latch transistor drain 132 and the P-channel drain 130 are connected by contact 144. The P-channel source 134 is connected to a programming voltage through metal contact 146. Contact 148 connects the P-channel gate 126 to the P-channel drain in the other branch of the nonvolatile latch (not shown).

A preferred fabrication is illustrated in FIGS. 4a–4k, 5a–5k and 6a–6k, which are respectively sectional views of the EEPROM 102, latch transistor 104 and P-channel transistor 106 shown in FIG. 3 in successive stages of fabrication. The P-channel transistor is described for the purposes of simplicity and clarity. When an entire chip is fabricated, including perhaps 32,000 nonvolatile cells and their support circuitry, other P and N-channel transistors are formed simultaneously with P-channel transistor 106 and realize the same improvement in linewidth control. Conventional semiconductor processing techniques are used to prepare the substrate prior to fabricating the gate structure and to complete the nonvolatile memory device after gate fabrication.

FIGS. 4a, 5a and 6a are sectional views of the EEPROM, latch transistor and P-channel transistor areas of the substrate 108, respectively. In the preferred embodiment, the EEPROM and latch transistor are N-channel devices. The invention is also applicable to P-channel devices, although they require more power. The N-silicon substrate 108 has P-wells 150a, 150b that are separated by field oxide regions 152, approximately 7,000Å to 10,000Å thick, to form the active areas 154a, 154b for the EEPROM and latch transistor, respectively. The active area 154c for the P-channel transistor is formed in the substrate 108. A thin oxide layer 156, approximately 400–500Å thick, is formed over the substrate, and an electron tunnel 158, suitably 0.5–2μ wide, is etched in the oxide layer 156 above the EEPROM active area 154a. A thin tunnel oxide 160, approximately 80–90Å thick, is formed over the EEPROM area including the electron tunnel 158.

In FIGS. 4b, 5b and 6b, a polysilicon (POLY1) layer 162 is formed on top of the substrate 108. The POLY1 layer must be thick enough to form transistor gates, approximately 1500Å thick, but does not have to be thick enough to prevent ion implant penetration. The POLY1 layer suitably has a resistance of approximately 200 ohms per square. The square unit is defined by the minimum linewidth of the particular fabrication process. A dielectric layer 168, equivalent to about 325Å of silicon oxide dielectric characteristics, is also formed over POLY1. The dielectric layer 168 is suitably a silicon oxide/nitride/oxynitride composite.

In FIGS. 4c, 5c and 6c, a POLY1 photoresist 164 is patterned over the POLY1 layer 162 and the dielectric layer 168, and delineates the EEPROM floating gate 116, covers the latch transistor active area 154b and exposes the POLY1 layer 162 over the P-channel active area 154c. The composite dielectric layer 168 and the POLY1 layer are etched to form the EEPROM floating gate 116 and a latch transistor gate region 166, after which the remaining photoresist is dissolved as shown in FIGS. 4d, 5d and 6d. The remaining thin oxides 156 and 160 are also removed. Another dielectric oxide layer 169, approximately 450Å thick is formed over the substrate to provide the gate oxide for the P-channel transistor. The same dielectric layer 169 becomes thicker, approximately 1000Å, and adheres to the sides of the EEPROM floating gate 116 and the latch transistor gate region 166, as shown in FIGS. 4e, 5e and 6e.

Figure 4H:
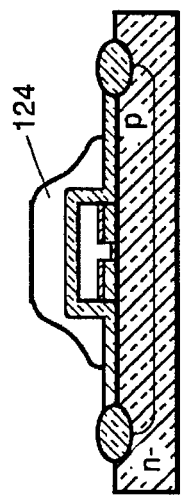
Figure 5H:
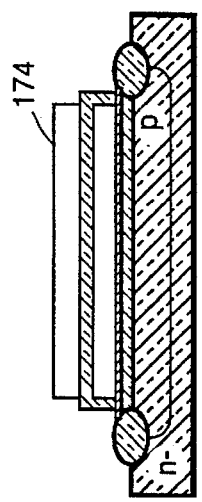
Figure 6H:
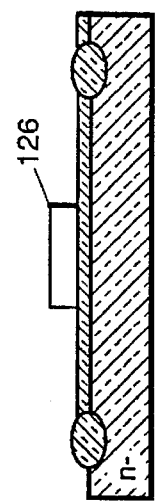

As shown in FIGS. 4f, 5f and 6f, a polysilicon (POLY2) layer 170 is formed over the EEPROM floating gate 116, latch transistor gate region 166 and P-channel area on the substrate 108. The POLY2 layer should be thick enough, approximately 5,000Å thick, to prevent ions during the ion implantation of the drain/source regions from penetrating through to the substrate. The POLY2 layer 170 suitably has a resistance of approximately 15 ohms per square. In FIGS. 4g, 5g and 6g, a POLY2 photoresist pattern 172 is patterned over the POLY2 layer 170 and delineates the EEPROM control gate 124, covers the latch transistor gate region 166 and delineates the P-channel transistor gate 126. The exposed portions of the POLY2 layer are etched and the photoresist is dissolved to form the EEPROM control gate 124, a latch transistor gate region 174 and the P-channel gate 126 as shown in FIGS. 4h, 5h and 6h.

Figure 4I:
Figure 4J:
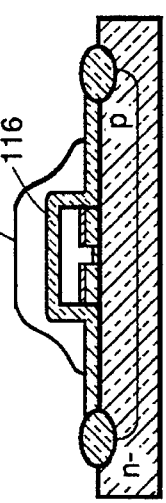
Figure 5I:
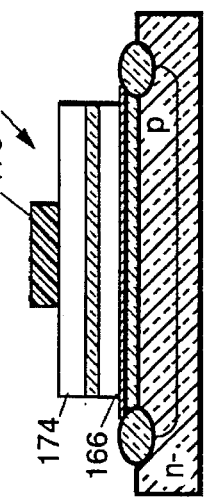
Figure 5J:
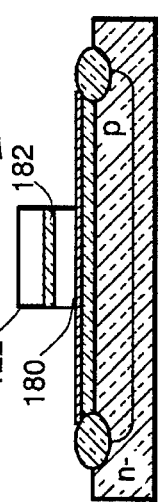
Figure 6I:
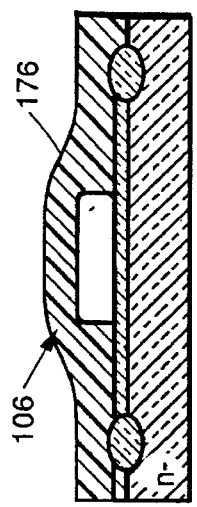
Figure 6J:
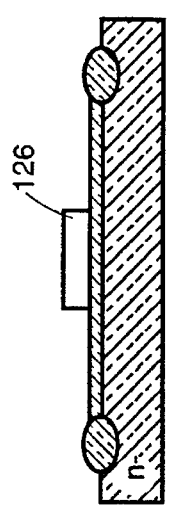

A SGPO photoresist 176 is patterned over the substrate to cover the EEPROM 102 and the P-channel transistor 106, and to delineate the latch transistor stacked gate 118 over the latch transistor gate regions 166 and 174 as shown in FIGS. 4i, 5i and 6i. As shown in FIGS. 4j, 5j and 6j, the exposed portions of the POLY2 and POLY1 layers are etched to form the stacked gate 118, after which the SGPO photoresist is dissolved. The stacked gate comprises the protective POLY2 layer 122 that is positioned over and separated from a gate 180 (remaining from the original gate region 166) by the remaining portion of the dielectric composite layer 168, which forms a dielectric spacer 182. The etching is accomplished in three steps: the POLY2 layer 170 is etched to a depth of 5,000Å, the exposed dielectric oxide layer 168 is removed, and the POLY1 layer 162 is etched to a depth of 1,500Å.

Figure 4K:
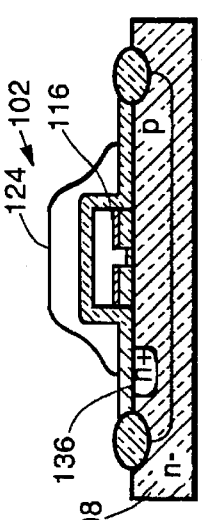
Figure 5K:
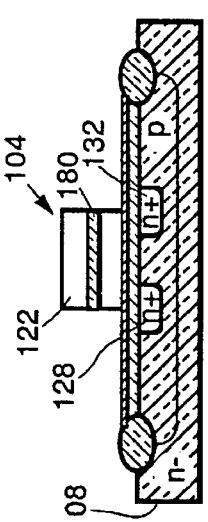
Figure 6K:
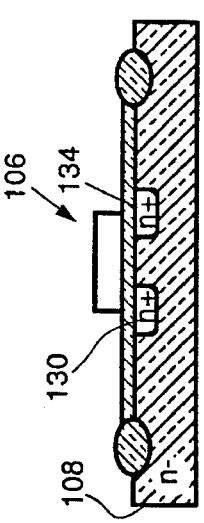

As shown in FIGS. 4k, 5k and 6k, the $N^+$ drain and source regions 132, 130 and 128, 134 of latch transistor 104 and P-channel transistor 106, and the $N^+$ p-well tie down 136 of the EEPROM 102, are ion implanted into the substrate 108. The active areas 154b and 154c form channels for the latch and P-channel transistors beneath their respective gates and between their drain and source regions. The protective POLY2 layer 122 over the thinner latch transistor gate 180 prevents ions from penetrating through the stacked gate to the transistor's channel 184. The protective layer is preferably electrically isolated from the latch gate and the remaining circuitry on the substrate.

The fabrication process does not form polysilicon spacers, and therefore does not create gaps between the latch transistor channel 184 and its drain and source regions 128 and 132. Furthermore, the process does not require overetching when the P-channel gate is formed, and hence the linewidth of the P-channel transistor 106 is approximately equal to its designed linewidth. For example, a P-channel gate 106 that was designed to have a width of 3μ was fabricated with an actual width of approximately 2.9μ, whereas in the prior art the gate was undercut to approximately 2.2μ. The protective layer 122, which prevents ion implantation penetration, allows the latch gate 180 and POLY1 layer 162 from which the latch gate is formed to be thin. Without the protective layer, the latch gate would have to block ion penetration. By thinning the POLY1 layer from approximately 5,000Å to 1,500Å, the etching time for the latch gate is reduced which diminishes the undercutting of the gate and improves the linewidth precision. By improving the linewidth control, the transistors' channel widths are more tightly controlled, improving performance and increasing yield rates. Furthermore, submicron (less than 1 micron) gates for the P-channel and support circuitry transistors can be designed and fabricated, thus greatly increasing the number of devices that can be fabricated on a given substrate.

While one embodiment of the invention has been shown and described, numerous variations and alternate embodiments will occur to those skilled in the art. For example, the fabrication process is not limited to the nonvolatile latch circuit. The fabrication of the EEPROM and latch transistor gate structure could be used in other memory devices. Such variations and alternate embodiments are contemplated, and can be made without departing from the spirit and scope of the invention as defined in the appended claims.

We claim:

1. A nonvolatile memory device, comprising:

a semiconductor substrate having Electrically Erasable-Programmable Read-Only Memory (EEPROM) and latch transistor active areas;

an electron tunnel that is disposed above said EEPROM active area;

an EEPROM having a floating gate that is positioned over said electron tunnel and a control gate that is positioned over said floating gate, said control gate being capable of receiving a data signal and storing it in said floating gate; and a latch transistor having a stacked gate that is positioned over said latch transistor active area, said stacked gate comprising a latch gate and a polysilicon layer above said latch gate, said latch gate being electrically connected to said floating gate, and said latch transistor being capable of receiving a programming signal to read out the stored data signal.

2. A nonvolatile memory device in accordance with claim 1, wherein said polysilicon layer is electrically isolated from said latch transistor gate.

3. A nonvolatile memory device in accordance with claim 1, wherein drain and source regions are ion implanted in said substrate on either side of said latch transistor gate, said protective layer being thick enough to prevent ion implantation penetration of said substrate and said latch transistor gate being thinner than the latch gate thickness that would be necessary to prevent ion implantation penetration in the absence of said protective layer.

4. A nonvolatile memory device in accordance with claim 1, wherein said said latch gate defines a channel in said substrate, and drain and source regions are ion implanted in said substrate on either side of said latch transistor gate such that they are immediately adjacent said channel to reduce the resistance between the drain and source regions and said channel.

* * * * *